United States Patent [19]

Yoshihara et al.

[11] Patent Number: 4,691,377
[45] Date of Patent: Sep. 1, 1987

[54] AUTOMATIC FREQUENCY AND GAIN CONTROL CIRCUIT

[75] Inventors: Masashi Yoshihara; Kazuo Yano, both of Tokyo, Japan

[73] Assignee: NEC Corporation, Japan

[21] Appl. No.: 776,848

[22] Filed: Sep. 17, 1985

[30] Foreign Application Priority Data

Sep. 19, 1984 [JP] Japan .................................. 59-196351

[51] Int. Cl.$^4$ ............................................. H04B 1/16
[52] U.S. Cl. .................................... 455/256; 455/259; 455/264; 455/240; 455/245; 455/192; 375/97; 375/98
[58] Field of Search ............... 455/256, 257, 258, 259, 455/264, 240, 245, 192, 200; 358/158, 174, 195.1; 375/97, 98

[56] References Cited

U.S. PATENT DOCUMENTS

| | | | |
|---|---|---|---|
| 2,896,018 | 7/1959 | Rhodes et al. | 455/257 |
| 3,619,492 | 11/1971 | Evans | 455/200 |
| 4,439,864 | 3/1984 | Qureshi | 375/98 |
| 4,472,707 | 9/1984 | Wilensky et al. | 358/174 |

Primary Examiner—Jin F. Ng
Assistant Examiner—Elissa Seidenglanz
Attorney, Agent, or Firm—Laff, Whitesel, Conte & Saret

[57] ABSTRACT

An AFC/AGC circuit utilized in a receiving apparatus of a ground station for the satellite communication system comprising a digital AFC/AGC controller functioning such that;

when the pilot signal is not received, the gain control voltage and the frequency control voltage are respectively set to appropriate values based on the predetermined data;

when the pilot signal starts to be received, the gain and frequency control voltages are switched from the set values to the values obtained from the digital AFC and AGC processings, respectively;

so long as the pilot signal is being received, the signal generated in the digital AFC and AGC processings are sampled by respective sampling clock signals and the gain and frequency control voltages are determined in accordance with the sampled data; and when the pilot signal stops being received, each of the gain and frequency control voltages is held at the value sampled by a last pulse of the sampling clock signal immediately before the stopping, respectively.

3 Claims, 4 Drawing Figures

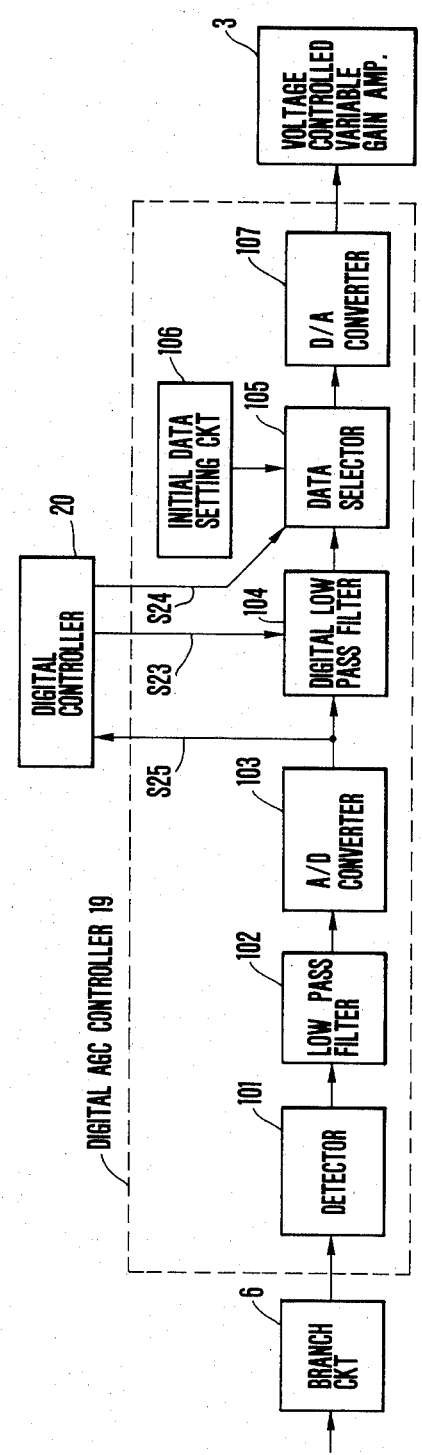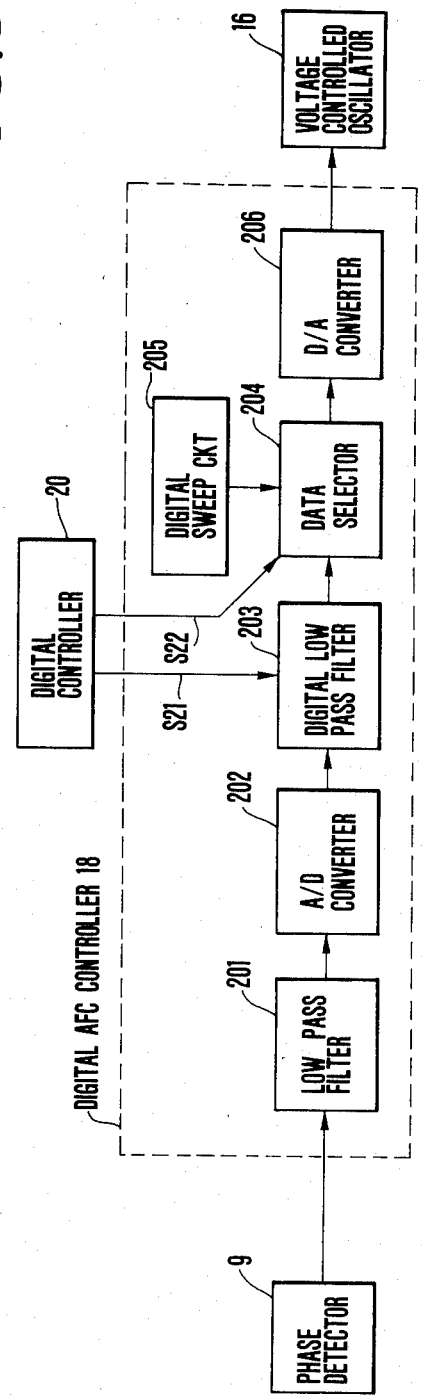

AUTOMATIC FREQUENCY AND GAIN CONTROL CIRCUIT

BACKGROUND OF THE INVENTION

This invention relates to an automatic frequency and gain control circuit utilized in the receiving apparatus in a ground station for satellite communication.

An automatic frequency control (AFC) and automatic gain control (AGC) circuit (hereinafter referred to AFC/AGC circuit) is provided for the receiving apparatus in a ground station for satellite communication. The purpose of the AFC/AGC circuit is to detect a frequency deviation and a level variation of a received reference signal, that is, a pilot signal and to supply the detected deviation and level variation to a demodulator. These AFC and AGC circuits have been constructed as analogue control circuits.

As will be described later in detail, the analog AFC/AGC circuit has various problems including misoperation of a reference signal detector and incapability of effecting desired sweeping.

SUMMARY OF THE INVENTION

It is an object of this invention to provide a novel AFC/AGC circuit capable of eliminating such problems by using digital technique.

According to automatic frequency and gain control circuit comprising an AFC mixer supplied with a received signal containing a received reference signal and controlled by an output signal of a voltage controlled oscillator; a voltage controlled variable gain amplifier for amplifying the output signal of the AFC mixer under the control of a gain control signal to send the amplified output signal thereof to a demodulator; a bandpass filter for passing only the received reference signal among an output of the voltage controlled variable gain amplifier; a digital AGC control means being supplied with an output of the bandpass filter for supplying the gain control signal to the voltage controlled variable gain amplifier such that an ouput level of the latter would be constant; an AFC phase detector for detecting the phase difference between the phases of the output of the bandpass filter and a reference signal generated by a local reference signal oscillator; a digital AFC control means supplied with the output of the AFC phase detector for controlling an oscillation frequency of the voltage controlled oscillator such that the output frequency of the AFC mixer would be constant; a received reference signal detector supplied with an output of the AFC phase detector for producing an output representing presence of the received reference signal; and a digital controller supplied with the output of the received signal detector for supplying sampling clock signals to the digital AFC control means and to the digital AGC control means when there is the received reference signal;

the digital AGC control means including means for setting the gain control voltage supplied to the voltage controlled variable gain amplifier to a predetermined value when the reference signal is not received, means for switching an input thereof from an output of the setting means to the output of the bandpass filter when the received reference signal starts to be received, and sampling the output of the bandpass filter by the sampling clock signal so long as the received reference signal is being received;

the digital AFC control means including means for setting an oscillation frequency of the voltage controlled oscillator to any desired value when the received reference signal is not received, means for switching an input thereof from an output of the oscillation frequency setting means to an output of the AFC phase detector when the reference signal starts to be received and means for sampling the output of the AFC phase detector by the sampling clock signal so long as the received reference signal is being received;

both of the digital AGC control means and the digital AFC control means respectively including means for holding the gain control voltage and the frequency control voltage at values sampled by respective last pulses before stopping of the sampling clock signal when the received reference signal is interrupted;

and either one or both of the digital AGC control means and the digital AFC control means including means for detecting the interruption of the received reference signal to send to the digital controller a signal that stops sending of the sampling clock signal.

BRIEF DESCRIPTION OF THE DRAWINGS

In the accompanying drawings:

FIG. 3 is a block diagram showing one example of the digital AGC controller 19 shown in FIG. 2; and FIG. 4 is a block diagram showing one example of the digital AFC controller 18 shown in FIG. 2.

DESCRIPTION OF THE PREFERRED EMBODIMENTS

Figure 1:
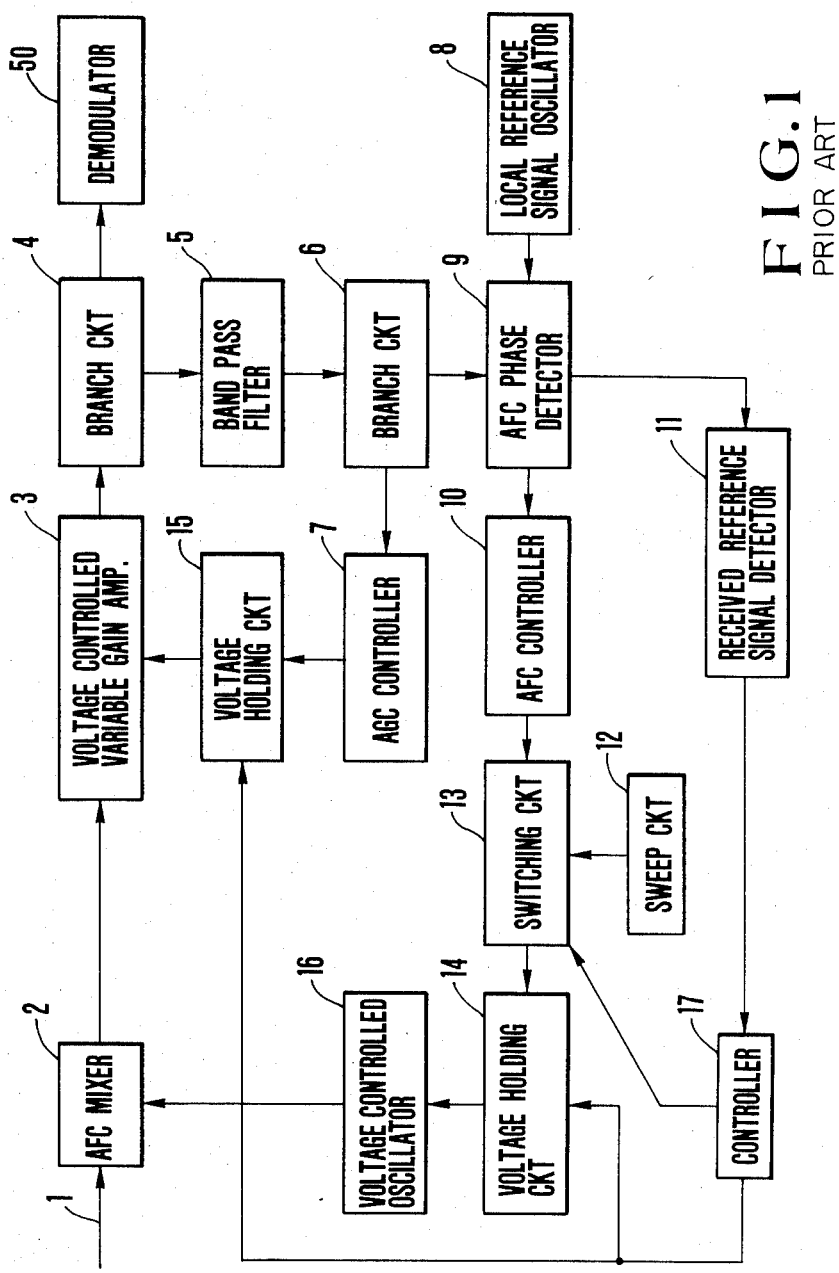
FIG. 1 is a block diagram showing a typical automatic frequency and gain control circuit which has been utilized in the related arts.

Before describing the embodiment of the invention, a typical AFC/AGC circuit which has been utilized in the related art will be firstly described with reference to FIG. 1. In FIG. 1, a received signal containing a received reference signal (pilot signal) is frequency converted by an AFC mixer 2, amplified by a voltage controlled variable gain amplifier 3 and then divided into two portions by a branch circuit 4. One portion is sent to a demodulator 50, while the other portion is sent to a bandpass filter 5 in which only the received reference signal is extracted. The extracted received reference signal is divided into two portions by another branch circuit 6. The divided portions are sent to an AGC controller 7 and an AFC phase detector 9. In the AFC phase detector 9, a phase of a reference signal generated by a local reference signal oscillator 8 and that of the signal sent from the branch circuit 6 are compared. The output of the AFC phase detector 9 is sent to an AFC controller 10 and a received reference signal detector 11. The received reference signal detector 11 judges that whether the received reference signal appears in the bandwidth of the bandpass filter 5 or not. When the received reference signal appears in the bandwidth, the received reference signal detector 11 detects it and supplies to a switching circuit 13 through a controller 17 a switching signal. The switching circuit 13 switches the output thereof from an output of a sweeping circuit 12 to an output of the AFC controller 10. When the received reference signal disappears, the controller 17 causes voltage holders 14 and 15 to hold for a certain interval their output voltages at the values before the disappearance of the received reference signal.

The output of the voltage holder 14 is applied to a voltage controlled oscillator 16 for determining the local frequency for the AFC mixer 2.

With the conventional circuit shown in FIG. 1, however, when the received reference signal is not received in the bandwidth of the bandpass filter 5, the gain of the amplifier 3 is the maximum. Under this state, at an instant when the received reference signal appears in the output of the bandpath filter 5, a signal of the maximum voltage level would be supplied to the AFC loop resulting in a misoperation of the received reference signal detector 11.

On the other hand, when the received reference signal disappears, the gain of the voltage controlled variable gain amplifier 3 would be caused to vary until the received reference signal detector 11 operates the controller 17 by detecting such interruption, because the detection speed of the AGC controller 7 is faster than that of the received reference signal detector 11. There are limits for the holding times of the voltage holders 14 and 15 due to analogue control. Moreover, since the sweeping circuit 12 is also subjected to analogue control it is difficult to effect any desired sweeping.

As above described, the invention contempletes elimination of various problems of the AFC/AGC circuit shown in FIG. 1 by using digital technique.

Figure 2:
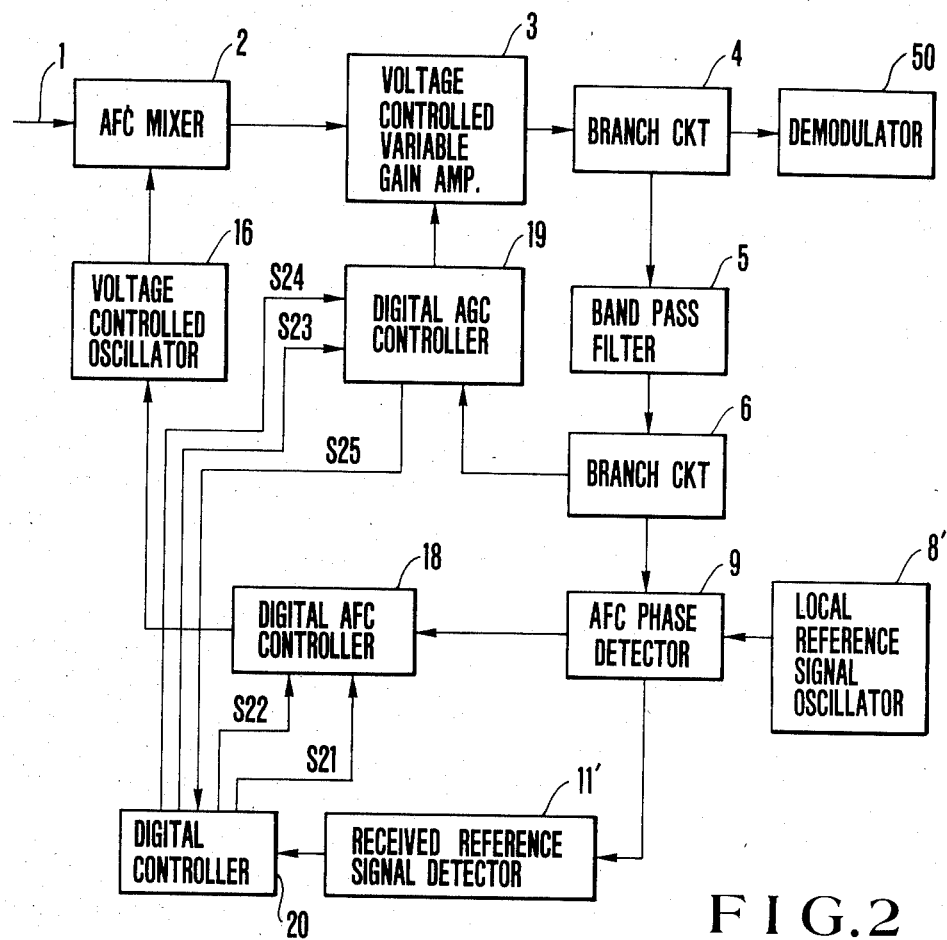
FIG. 2 is a block diagram showing one embodiment of this invention.

A preferred embodiment of this invention will now be described with reference to FIG. 2 in which the same elements shown in FIG. 1 are designated by the same reference numerals. In FIG. 2, one output of the branch circuit 6 is supplied to the AFC phase detector 9. One output of the AFC phase detector 9 is sent to a digital AFC controller 18 whose output controls the voltage controlled oscillator 15. The other output of the branch circuit 6 is sent to the digital AGC controller 19 whose output is applied to the amplifier 3 for controlling the gain thereof. In response to the other output of the AFC phase detector 9, a received reference signal detector 11' detects the received reference signal and supplies the detected signal to a digital controller 20. The digital controller 20 produces a sampling clock signals S21 and S23 which operate the digital AFC controller 18 and the digital AGC controller 19 so long as the received reference signal is received. The digital controller 20 also supplies data switching signals S22 and S24 to the digital AFC controller 18 and to the digital AGC controller 19 when the received reference signal appears. The digital controller 20 is supplied from the digital AGC controller 19 with a signal S25 representing the interruption of the received reference signal for stopping sampling clock signals S21 and S23 sent to the digital AFC controller 18 and the digital AGC controller 19.

The digital AFC controller 18 has a performance of digitally sweeping at a predetermined period. Until the data switching signal S22 is applied, the digital AFC controller 18 sends an output produced as a result of digital sweeping performance to the voltage controlled oscillator 16, but when it is supplied with the data switching signal S22, it samples the output of the AFC phase detector 9 in accordance with the sampling clock signal S21, thereby supplying sampled voltage to the voltage controlled oscillator 16. As the supply of the sampling clock signal S21 is stopped, the voltage value sampled by the last pulse immediately before stopping the sampling clock signal S21 is held temporarily.

After elapse of a definite interval, the digital AFC controller 18 sends out an output caused by the sweeping performance until data switching signal S22 is applied.

The digital AGC controller 19 supplies to the amplifier 3 the predetermined output voltage, before the application of the data switching signal S24. When impressed with the data switching signal S24, the digital AGC controller 19 samples the output of the branch circuit 6 in accordance with the sampling clock signal S23 for supplying the sampled voltage to the amplifier 3. The digital AGC controller 19 detects the fact that the received reference signal has been interrupted in accordance with the output of the branch circuit 6 for sending a reference signal interruption detection signal S25 to the digital controller 20. As the sampling clock signal S23 is stopped in response to the reference signal interruption detection signal S25, the voltage value sampled by the last pulse immediately before stopping of the sampling pulse S23 is held temporarily. After the elapse of a predetermined interval, the voltage is maintained at the predetermined value described above until the data switching signal S24 is applied.

FIG. 3 is a block diagram showing one example of the digital AFC controller 18 shown in FIG. 2. As shown in FIG. 3, the output terminal of branch circuit 6 is connected to the input terminal of a detector 101 with its output terminal connected to the input terminal of a low pass filter 102. The output terminal of the low pass filter 102 is connected to the input terminal of an analogue-to-digital (A/D) converter 103 with its output terminal connected to the input terminal of a digital low pass filter 104 and to the signal S25 input terminal of the digital controller 20. The control terminal of the digital low pass filter 104 is connected to the sampling clock signal S23 output terminal of the digital controller 20. The output terminal of the digital low pass filter 104 is connected to one data input terminal of a data selector 105. The other data input terminal of the data selector 105 is connected to the output terminal of an initial data setting circuit 106. The output terminal of the data selector 105 is connected to the input terminal of a digital-to-analogue (D/A) converter 107 with its output terminal connected to the voltage controlled variable gain amplifier 3.

The circuit shown in FIG. 3 operates as follows. More particularly, the output signal from the branch circuit 6 is detected by detector 101. The waveform of the output of the detector 101 is shaped by the low pass filter 102 and then the output is converted into a digital signal by the A/D converter 103. The digital signal is supplied to the digital low pass filter 104 and to the digital controller 20 to act as a reference signal interruption detection signal S25 for detecting the variation in the output signal when the received reference signal is interrupted. The digital controller 20 detects the variation in the output of the A/D converter 103, and when it is judged that the variation is caused by the interruption of the received reference signal, the sampling clock signal 23 supplied to the digital AGC controller 19 is stopped.

The sampling clock signal S23 supplied to the digital low pass filter 104 functions such that the sampling operation is continued so long as the sampling clock pulse of the definite period is being supplied continuously, but when the sampling clock pulse is stopped, the value of the output voltage sampled by the last sampling clock pulse is held temporarily.

The output signal of the digital low pass filter 104 is supplied to the data selector 105 which is also supplied with an input signal from the initial data setting circuit 106. The initial data setting circuit 106 sets the initial data for obtaining any desired gain of the amplifier 3 when the received reference signal is not contained in the bandwidth of the bandpass filter 5 shown in FIG. 2. The data selector 105 is controlled by the data switching signal S24 from the digital controller 20. More particularly, when the data switching signal S24 shows that the received reference signal does not present in the bandwidth of the bandpass filter 5, the data selector 105 selects the signal from the initial data setting circuit 106, whereas the reference signal presents the data selector 105 selects the signal from the digital low pass filter 104. The selected signals are supplied to D/A converter 107. The analogue signal thus obtained is applied to the voltage controlled variable gain amplifier 3. Consequently, the gain of this amplifier 3 can be set to a suitable value by the initial data setting circuit 106 when the received reference signal is not received.

FIG. 4 is a block diagram showing one example of the digital AFC controller 18 shown in FIG. 2. As shown in FIG. 4, the output terminal of the AFC phase detector 9 is connected to the input terminal of a low pass filter 201, which the output terminal of this filter 201 is connected to the input terminal of an A/D converter 202 with its output terminal connected to the input terminal of a digital low pass filter 203. The control terminal of this filter 203 is connected to the output terminal of the sampling clock signal S21. The output terminal of the digital low pass filter 203 is connected to one input terminal of the data selector 204, while the other data input terminal of the data selector 204 is connected to the output terminal of a digital sweep circuit 205. The control terminal of the data selector 204 is connected to receive the data switching signal S22 from the digital controller 20. The data selector 204 switches the two inputs in accordance with the data switching signal S22 for applying its output to the digital D/A converter 206. The output terminal of this converter 206 is connected to the input terminal of the voltage controlled oscillator 16.

The digital AFC controller 18 shown in FIG. 4 operates as follows. The waveform of the output voltage of the AFC phase detector 9 is shaped by the low pass filter 201 and the shaped voltage is converted into a digital signal by A/D converter 202. The resulting digital signal is filtered by the digital low pass filter 203 and then supplied to the data selector 204. While the sampling clock signal S21 is being continuously supplied from the digital controller 20, the digital low pass filter 203 samples the input signal and the sampled signal is supplied to the data selector 204. When the sampling clock signal S21 is stopped, an output voltage sampled by the last sampling pulse immediately before the stopping is temporarily held. The output signal of the digital low pass filter 203 is applied to one input terminal of the data selector 204. Until the received reference signal appears in the bandwidth of the bandpass filter 5 shown in FIG. 2, the digital sweeping circuit 205 digitally sweeps the frequency of the voltage controlled oscillator 16. The sweeping mode thereof can be set to any mode. The data selector 204 is controlled by the data switching signal S22 from the digital controller 20. When the received reference signal does not appear in the bandwidth of the bandpass filter 5, the data selector 204 selects the signal from the digital sweeping circuit 205 in accordance with the data switching signal S22, whereas when the received reference signal appears, the data selector 204 selects the signal from the digital low pass filter 203 and supplies the selected signals to the D/A converter 206. The analogue signal outputted by the D/A converter 206 controls the oscillation frequency of the voltage controlled oscillator 16. Consequently, the voltage controlled oscillator 16 can operate in desired optimum sweep mode even when the received reference signal is not received.

When the received reference signal is interrupted, the generation of the sampling clock signal S21 of the digital controller 20 is stopped. Accordingly, the output of the digital low pass filter 203 will have a voltage value sampled by the last pulse of the sampling clock signal S21 immediately before the interruption of the received reference signal, in the same manner as in the digital low pass filter 104 of the digital AGC controller 19 shown in FIG. 3.

In this embodiment, although interruption of the received reference signal is detected by using the output signal of the A/D converter 103 of the digital AGC controller 19, such detection can also be made by using the output of the A/D converter 202 of the digital AFC controller 18, or using the outputs of both controllers 18 and 19.

As above described, according to this invention, when the reference signal does not appear in the output of a bandpass filter 5 due to the fact that the reference signal is not sent or that the frequency of the voltage controlled oscillator 16 deviates greatly, since the gain of the amplifier 3 is set to a suitable value by the initial data setting circuit 106. As a result, even when the gain of the amplifier 3 is at the maximum, there is fear of misdetection of the received reference signal detector 11'.

Further, as the frequency sweeping means of the voltage controlled oscillator 16 is used a digital sweep circuit 205 capable of setting any desired sweeping mode, it is possible to effect more efficient sweeping than the analogue technique in which a saw tooth shaped frequency sweeping was made. Further, the interruption of the received reference signal is detected directly from a signal formed during the digital processing of the gain control voltage or the frequency control voltage, the detector delay time can be greatly reduced than the analogue type received reference signal detector 11, thus preventing deviation of the frequency control voltage or the gain control voltage which should be maintained at a definite value when the received reference signal is interrupted.

Moreover, since the holding of the frequency control voltage or the gain control voltage at the time of interruption of the received reference signal is made by a circuit that holds the voltage value sampled by the clock pulse immediately prior to the interruption, by stopping the sampling clock signal in the digital process which generates the frequency control voltage or the gain control voltage, the voltage can be held for longer time than the analogue circuit whereby a stable operation can be ensured for the interruption of the received reference signal over a longer time.

As above described, according to the AFC/AGC circuit embodying the invention, stable operations can be maintained at such states as the disappearance, the appearance and the interruption of the received reference signal which occur in a satellite.

What is claimed is:

1. An automatic frequency and gain control circuit comprising:

an AFC mixer supplied with a received signal containing a received reference signal and controlled by an output signal of a voltage controlled oscillator;

a voltage controlled variable gain amplifer for amplifying an output signal of said AFC mixer under the control of a gain control signal to send said amplified output signal thereof to a demodulator;

a bandpass filter for passing only said received reference signal among an output of said voltage controlled variable gain amplifier;

a branching means for branching the output of said bandpass filter into two portions;

a digital AGC control means being supplied with one portion of an output of said branching means for supplying said gain control signal to said voltage controlled variable gain amplifier such that an output level of said variable gain amplifier would be constant;

an AFC phase detector for detecting the phase difference between the phases of the other portion of the output of said branching means and a reference signal generated by a local reference signal oscillator;

a digital AFC control means supplied with an output of said AFC phase detector for controlling an oscillator frequency of said voltage controlled oscillator such that an output frequency of said AFC mixer would be constant; and a received reference signal detector supplied with an output of said AFC phase detector for producing an output representing a presence of said received reference signal, and a digital controller supplied with an output of said received reference signal detector for supplying sampling clock signal to said digital AFC control means and to said digital AGC control means when there is said received reference signals;

said digital AGC control means including means for setting the gain control voltage supplied to said voltage controlled variable gain amplifier to a predetermined value when said received reference signal is not received, means for switching its own input from an output of said setting means to an output of said bandpass filter when said received reference signal starts to be received, and means for sampling an output of said bandpass filter by said sampling clock signal so long as said received reference signal is being received;

said digital AFC control means including means for setting an oscillation frequency of said voltage controlled oscillator to any desired value when said received reference signal is not received, means for switching its own input from an output of said oscillation frequency setting means to an output of said AFC phase detector when said received reference signal starts to be received, and means for sampling the output of said AFC phase detector by said sampling clock signal so long as said received reference signal is being received;

both of said digital AGC control means and said digital AFC control means respectively including means responsive to an interruption said sampling clock signal for holding the gain control voltage and the frequency control voltage at values sampled by a last pulse before a stopping of the sampling clock signal when said received reference signal is interrupted; and either one or both of said digital AGC control means and said digital AFC control means including means for detecting the interruption of said received reference signal to send to said digital controller a signal that stops sending of said sampling clock signal.

2. The automatic frequency and gain control circuit according to claim 1 wherein said AGC control means comprises a detector that detects the output signal of said bandpass filter, a low pass filter filtering an output signal of said detector, and analogue-to-digital converter for converting an output signal of said low pass filter into a digital signal to supply a signal representing an interruption of said received reference signal to said digital controller, a digital low pass filter which samples an output of said analogue-to-digital converter by said sampling clock signal from said digital controller, an initial data setting circuit for setting the gain control voltage when said reference signal is not received; a data selector for selecting either one of an output signal of said initial data setting circuit and an output signal of said digital low pass filter in response to a signal from said digital controller representing that said received reference signal is detected, and a digital-to-analogue converter for converting an output of said data selector into an analogue signal which is supplied to said voltage controlled variable gain amplifiers.

3. The automatic frequency and gain control circuit according to claim 1 wherein said AFC control means comprises a low pass filter filtering an output of said AFC phase detector, an analogue-to-digital converter for converting an output of said low pass filter into an digital signal, a digital low pass filter for sampling said digital signal by said sampling clock signal from said digital controller, a digital sweep circuit for setting a sweeping mode of said voltage controlled oscillator when said received reference signal is not received, a data selector selecting either one of the outputs of said digital sweep circuit and said digital low pass filter in response to a signal from said digital controller representing that said received reference signal is detected, and a digital-to-analogue converter converting an output signal from said data selector into an analogue signal to supply it to said voltage controlled oscillator.

* * * * *